United States Patent
Ottlinger et al.

(10) Patent No.: US 11,104,114 B2
(45) Date of Patent: Aug. 31, 2021

(54) METHOD FOR PRODUCING A MULTI-LAYERED STRUCTURAL ELEMENT, AND A MULTI-LAYERED STRUCTURAL ELEMENT PRODUCED ACCORDING TO SAID METHOD

(71) Applicant: EPCOS AG, Munich (DE)

(72) Inventors: Marion Ottlinger, Deutschlandsberg (AT); Marlene Fritz, Graz (AT)

(73) Assignee: EPCOS AG, Munich (DE)

( * ) Notice: Subject to any disclaimer, the term of this patent is extended or adjusted under 35 U.S.C. 154(b) by 620 days.

(21) Appl. No.: 14/398,422

(22) PCT Filed: Apr. 22, 2013

(86) PCT No.: PCT/EP2013/058299
§ 371 (c)(1),
(2) Date: Oct. 31, 2014

(87) PCT Pub. No.: WO2013/167368
PCT Pub. Date: Nov. 14, 2013

(65) Prior Publication Data
US 2015/0132589 A1    May 14, 2015

(30) Foreign Application Priority Data
May 7, 2012    (DE) .......................... 102012103994.1

(51) Int. Cl.
| | | |
|---|---|---|
| B32B 38/00 | (2006.01) | |
| B32B 15/04 | (2006.01) | |
| B32B 15/20 | (2006.01) | |
| B32B 18/00 | (2006.01) | |
| H01G 4/008 | (2006.01) | |
| H01G 4/012 | (2006.01) | |
| H01G 4/12 | (2006.01) | |

(Continued)

(52) U.S. Cl.
CPC .......... *B32B 38/0036* (2013.01); *B32B 15/04* (2013.01); *B32B 15/20* (2013.01);
(Continued)

(58) Field of Classification Search
CPC ... H01L 41/273; H01L 41/33; H01L 41/0477; H01L 41/0838; H01L 41/312;
(Continued)

(56) References Cited

U.S. PATENT DOCUMENTS

| | | |
|---|---|---|
| 5,459,368 A | 10/1995 | Onishi et al. |
| 5,468,315 A | 11/1995 | Okada et al. |

(Continued)

FOREIGN PATENT DOCUMENTS

| | | |
|---|---|---|
| DE | 69415235 T2 | 5/1999 |
| DE | 10164354 A1 | 8/2002 |

(Continued)

*Primary Examiner* — Alex B Efta
(74) *Attorney, Agent, or Firm* — Slater Matsil, LLP

(57) ABSTRACT

A multi-layered structural element and a method for producing a multi-layered structural element are disclosed. In an embodiment dielectric green sheets, at least one ply containing an auxiliary material which contains at least one copper oxide and layers containing electrode material are provided and arranged alternately one above another. These materials are debindered and sintered. The copper oxide is reduced to form the copper metal and the at least one ply is degraded during debindering and sintering.

19 Claims, 5 Drawing Sheets

(51) Int. Cl.
- *H01G 4/30* (2006.01)
- *H01L 41/083* (2006.01)
- *C04B 37/00* (2006.01)
- *H01L 41/273* (2013.01)
- *H01B 1/02* (2006.01)

(52) U.S. Cl.
CPC ............ *B32B 18/00* (2013.01); *C04B 37/006* (2013.01); *H01B 1/026* (2013.01); *H01G 4/008* (2013.01); *H01G 4/012* (2013.01); *H01G 4/1245* (2013.01); *H01G 4/30* (2013.01); *H01L 41/0838* (2013.01); *H01L 41/273* (2013.01); *B32B 2305/80* (2013.01); *B32B 2307/204* (2013.01); *B32B 2311/12* (2013.01); *B32B 2457/00* (2013.01); *B32B 2457/16* (2013.01); *C04B 2237/124* (2013.01); *C04B 2237/60* (2013.01); *Y10T 428/31678* (2015.04)

(58) Field of Classification Search
CPC ............... H01L 41/183; C04B 2237/60; C04B 2237/58; C04B 2237/124; C04B 37/006; B32B 38/0036; B32B 2038/0044
See application file for complete search history.

(56) References Cited

U.S. PATENT DOCUMENTS

| | | |
|---|---|---|
| 6,960,271 B2 | 11/2005 | Shindo et al. |
| 8,314,535 B2 | 11/2012 | Dernovsek et al. |
| 2002/0121329 A1* | 9/2002 | Shindo ................. H01G 4/0085 156/89.12 |
| 2002/0149297 A1* | 10/2002 | Yamamoto ............ H01L 41/083 310/328 |
| 2004/0139599 A1* | 7/2004 | Sumiya ................. H01G 4/008 29/831 |
| 2009/0220765 A1* | 9/2009 | Okamura ............. H01L 41/0471 428/316.6 |
| 2010/0139621 A1 | 6/2010 | Murai et al. |
| 2010/0320876 A1* | 12/2010 | Dernovsek .......... H01L 41/0477 310/364 |
| 2012/0119616 A1 | 5/2012 | Dernovsek et al. |
| 2014/0292161 A1 | 10/2014 | Döllgast et al. |

FOREIGN PATENT DOCUMENTS

| | | |
|---|---|---|
| DE | 10215992 A1 | 11/2002 |
| DE | 10351377 A1 | 10/2004 |
| DE | 102010020192 A1 | 11/2011 |
| DE | 102011109008 A1 | 1/2013 |
| JP | S62282409 A | 12/1987 |
| JP | H08167536 A | 6/1996 |
| JP | 2000106035 A | 4/2000 |
| JP | 2002314156 A | 10/2002 |
| JP | 2005136260 A | 5/2005 |
| JP | 2005142222 A | 6/2005 |
| JP | 2006108546 A | 4/2006 |
| JP | 2008244458 A | 10/2008 |
| JP | 2011510505 A | 3/2011 |
| WO | 2010139568 A1 | 12/2010 |

* cited by examiner

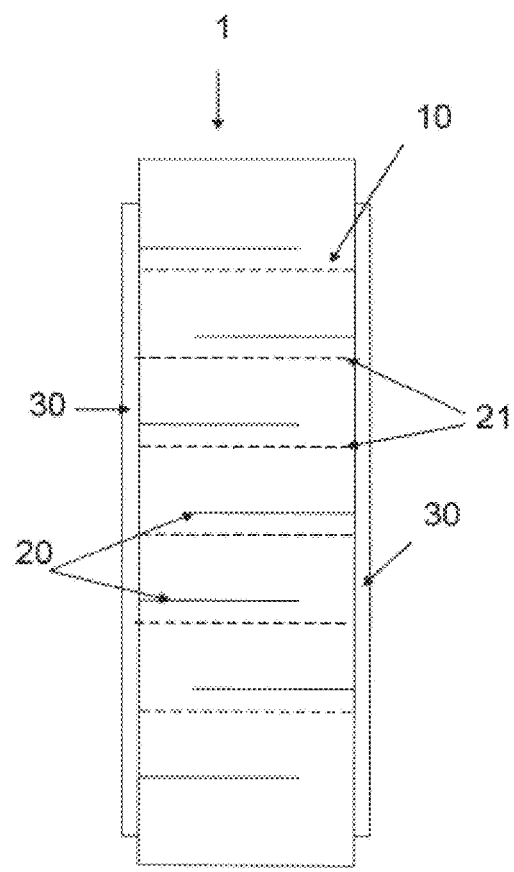

100% Cu₂O

100% CuO

Standard 50% Cu / 50% CuO

100% Cu

METHOD FOR PRODUCING A MULTI-LAYERED STRUCTURAL ELEMENT, AND A MULTI-LAYERED STRUCTURAL ELEMENT PRODUCED ACCORDING TO SAID METHOD

This patent application is a national phase filing under section 371 of PCT/EP2013/058299, filed Apr. 22, 2013, which claims the priority of German patent application 10 2012 103 994.1, filed May 7, 2012, each of which is incorporated herein by reference in its entirety.

TECHNICAL FIELD

Embodiments of the invention provide a method for producing a dielectric multi-layered structural element, in which a stack of dielectric green sheets, at least one ply containing an auxiliary material and layers of electrode material is formed, debindered and sintered. E a multi-layered structural element produced by the method.

BACKGROUND

The method can be used, for example, to produce a piezo actuator that can be used for actuating an injection valve in a motor vehicle.

The reliability of piezoelectric multi-layered structural elements depends on the control of cracks which possibly arise during their production. Cracks of this nature can arise, for example, during thermal processes, such as sintering, metallization and soldering, or upon polarization, since elastic stresses are formed on account of different expansions in various regions of the structural element. It is preferable for these cracks to arise during operation in application. Cracks which arise during the thermal processes, during metalization or soldering, are insignificant and are not processed further after appropriate process controls have been carried out. Such so-called relaxation cracks or poling cracks can furthermore change direction, extend perpendicularly to the electrodes and therefore, for example, bridge two electrodes, which leads to a short circuit and to failure of the structural element.

SUMMARY OF THE INVENTION

In some embodiments a method for producing a dielectric multi-layered structural element increases reliability. A multi-layered structural element produced by embodiments of the method is provided.

The method for producing a dielectric multi-layered structural element, comprises the following steps:

A) providing an electrode material and green sheets containing a dielectric material, B) providing an auxiliary material which contains at least one copper oxide, C) forming a stack (1), in which dielectric green sheets, at least one ply containing the auxiliary material and layers containing the electrode material are arranged alternately one above another, D) debindering and sintering the stack (1), wherein, during method step D), the copper oxide is reduced to form the copper metal and the at least one ply is degraded.

This method produces a dielectric multi-layered structural element which comprises dielectric ceramic layers with internal electrodes arranged between them and also at least one weakening layer.

"Alternately" in relation to the stack formed in method step C) may also mean that a layer of electrode material or a ply of auxiliary material is not applied to every green sheet. By way of example, some piezoelectric green sheets may be arranged one above another, without there being any layers of electrode material between them.

The layers of electrode material form the internal electrodes in the finished multi-layered structural element, and they may be applied to the green sheets as a metal paste, for example, by a screen printing method.

If more than one ply containing the auxiliary material are arranged in the stack in method step C), they can be present at regular or irregular intervals in the stack. According to one embodiment, the plies containing the auxiliary material can be arranged parallel or largely parallel to two layers containing electrode material and adjacent to two green sheets.

The method makes it possible to control the formation of regions in the multi-layered structural element in which cracks can form in a targeted manner by virtue of the fact that the ply containing the auxiliary material is degraded during the method. By virtue of the degradation of the auxiliary material, this is largely or entirely no longer present in the finished structural element, while a weakening layer forms at the position of the ply, in the region of which there is a predetermined breaking point in the multi-layered structural element. If cracks form, they run out in the structural element in the region of the weakening layer. The formation of uncontrolled cracks can thus be reduced or prevented.

The stack formed in method step C) is subsequently compressed, and then the green sheets, the at least one ply containing the auxiliary material and the layers of electrode material are debindered and sintered together in method step D), so that a multi-layered structural element comprising dielectric layers with internal electrodes arranged between them and at least one weakening layer is formed.

According to one embodiment, the electrode material and the auxiliary material can be selected in such a way that they both contain copper, the copper being present in a smaller proportion in the electrode material than in the auxiliary material. In this context, the term "copper" is to be understood as a general designation, and therefore encompasses, for example, pure copper metal, copper alloys and copper cations, irrespective of their states of matter. The terms "copper metal" and "copper alloys" are assigned to copper having the oxidation number 0. The term "copper oxide" denotes CuO (oxidation number of the copper: 2) and/or $Cu_2O$ (oxidation number of the copper: 1). The auxiliary material contains at least one copper oxide, preferably CuO or $Cu_2O$, particularly preferably CuO.

"In a smaller proportion" is to be understood as meaning that the total concentration of the copper is lower in the electrode material than in the auxiliary material. This difference in concentration has the effect that, during the debindering and sintering in method step D), diffusion of the copper can take place from the ply toward at least one of the layers containing electrode material. This diffusion is effected here through the dielectric layers adjacent to the ply. Diffusion of the copper is already possible during the debindering, i.e. at temperatures below 600° C., if the copper is present in the auxiliary material as copper oxide. The diffusion of the copper is promoted in particular if the copper is present in the auxiliary material as CuO (oxidation number 2). The mobility of the copper into the dielectric layers is given by the difference in concentration as a driving force. It is preferable that the auxiliary material does not contain any copper metal (oxidation number 0). It is particularly preferable that the auxiliary material consists only of one component.

It is preferable that the oxygen partial pressure is set during the debindering and sintering in such a way that the copper oxide (oxidation number 1 or 2) is reduced to form copper metal (oxidation state 0). To this end, the process window during the debindering and sintering is set in each case in such a way that the equilibrium partial pressure of the oxygen which is established lies between the curves Pb/PbO and $Cu_2O/Cu$ (such that PbO and Cu are present at the same time) (see, e.g., FIG. 4). It is preferable that during the debindering the oxygen partial pressure is set to a value of $pO_2=10^{-18}-10^{-13}$ atm at 600° C. and to a value of $pO_2=10^{-40}-10^{-35}$ atm at 200° C. The sintering is preferably carried out at a temperature of 1010° C. within the equilibrium curves of $Cu_2O/Cu$ and Pb/PbO (see, e.g., FIG. 4). The atmosphere during the sintering is preferably set from a mixture of $H_2O/N_2$ and $H_2$.

In one embodiment, the reduction of the copper oxide to form the copper metal (oxidation state 0) has largely concluded after the debindering process, i.e. at temperatures below 600° C. The corresponding investigations were carried out by scanning electron microscopy in combination with EDX. The sample before the debindering clearly showed the existence of metallic Cu in addition to $Cu_2O$ and CuO in the corresponding printing layer. After the debindering, it was possible to verify only metallic Cu with minimal superficial oxidation at this site.

The method therefore makes it possible to degrade the auxiliary material in a targeted manner and to thereby build up a weakening layer, without attacking the metal in the electrode material in the process.

In conventional methods, in which oxidation of the auxiliary material in a manner controlled by way of the sintering atmosphere is carried out, spatially targeted oxidation cannot be implemented, since the oxidation also takes place on the electrode material; this is undesirable, since on the one hand oxidized electrode material can diffuse away and thereby dissolve the electrode layer and on the other hand the ply which is to be formed to give the weakening layer cannot be degraded completely.

Furthermore, in method step D), the copper ions (oxidation state 1 or 2) can diffuse toward at least one of the layers containing electrode material.

"Diffuse" is to be understood as meaning that the copper ions diffuse until they are reduced to form copper metal. Once the reduction has finished completely, only copper metal which can scarcely diffuse is still present. As a result, the copper oxides, in which the copper is present in oxidation state 1 or 2, can therefore diffuse toward the electrode material. In this case, the metal diffuses as cation. Owing to the relatively high mobility of the divalent copper ions compared to the monovalent copper ions, CuO is preferred to $Cu_2O$.

Through the reduction and, if appropriate, diffusion of the copper ions from the copper oxide, a weakening layer is formed in the region of the ply containing the auxiliary material in the stack. A porous weakening layer, which can also be understood as a weakening region, therefore forms in the region of the ply. In this respect, a weakening layer signifies a ply with a reduced fracture strength compared to the other dielectric layers of the multi-layered structural element. The fracture strength is in this case preferably set by a suitable selection of the auxiliary material (ratio of CuO to $Cu_2O$; quantity and grain size of the copper oxide) in such a way that stress cracks extend along the weakening layer in the multi-layered structural element, in which case the strength of the multi-layered element is not impaired. In detail, the ply which contained the auxiliary material before method step D) is degraded by the copper oxide from the auxiliary material being reduced to form copper metal during the debindering and if appropriate diffusing in the direction of the electrode layers.

According to one embodiment, the electrode material contains copper, preferably copper metal or a copper alloy.

According to one embodiment, a piezoelectric material is used as the dielectric material. By way of example, it is possible to use the lead zirconate titanate system ($Pb(Zr_x Ti_{1-x})O_3$ (where $0 \leq x \leq 1$) or PZT) as the ceramic material.

After the sintering, external electrodes can furthermore be applied to two opposing external faces of the multi-layered structural element. To this end, a base metalization can be fired on the stack, for example. The internal electrodes are preferably connected to the external electrodes alternately along the stacking direction of the structural element. To this end, the internal electrodes are led, for example, alternately as far as one of the external electrodes and are at a distance from the second external electrode. In this way, the internal electrodes of one polarity are electrically connected to one another via a common external electrode.

In a further aspect, the invention relates to multi-layered structural elements, such as actuators and capacitors, obtainable by the above method.

BRIEF DESCRIPTION OF THE DRAWINGS

The stated method and the advantageous configurations thereof will be explained herein below on the basis of schematic figures, which are not true to scale, and also on the basis of an exemplary embodiment.

FIG. 1 shows the schematic side view of a multi-layered structural element produced by the method;

DETAILED DESCRIPTION OF ILLUSTRATIVE EMBODIMENTS

Figure 2A:
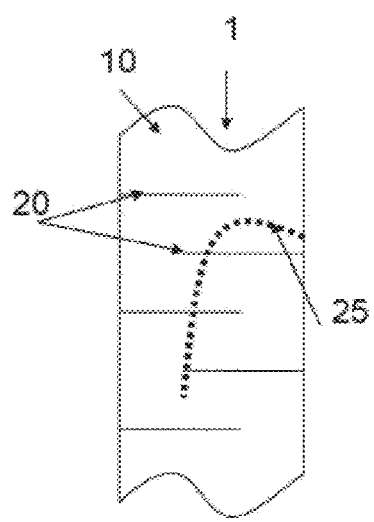
FIGS. 2a and 2b show enlarged schematic side views of a multi-layered structural element.

FIG. 1 shows a schematic side view of a piezoelectric multi-layered structural element in the form of a piezo actuator. The structural element comprises a stack 1 of piezoelectric layers 10 arranged one above another and internal electrodes 20 lying between them. The internal electrodes 20 are formed as electrode layers. The piezoelectric layers 10 and the internal electrodes 20 are arranged one above another. Weakening layers 21 are shown in FIG. 1 between piezoelectric layers 10 and parallel to the internal electrodes 20. The weakening layer 21 is to be understood to be a region in which predetermined breaking points are present in the structural element.

The piezoelectric layers 10 contain a ceramic material, for example, lead zirconate titanate (PZT) or a lead-free ceramic. The ceramic material may also contain dopants. The internal electrodes 20 contain, for example, a mixture or an alloy of Cu and Pd.

In order to produce the stack 1, for example, green sheets which contain a ceramic powder, an organic binder and a solvent are produced by sheet drawing or sheet casting. An electrode paste is applied by screen printing to some of the green sheets, in order to form the internal electrodes 20. Furthermore, plies containing an auxiliary material having a first and a second component are applied to one or more green sheets in order to form weakening layers 21. The green sheets are stacked one above another along a length direction and compressed. The intermediate products of the structural elements are separated in the desired shape from the sheet stack. Lastly, the stack of piezoelectric green sheets, plies of auxiliary material and electrode layers is debindered and sintered. External electrodes 30, which are also shown in FIG. 1, are furthermore applied after the debindering and sintering.

In the embodiment shown here, the external electrodes 30 are arranged on opposing side faces of the stack 1 and extend in the form of strips along the stacking direction. The external electrodes 30 contain, for example, Ag or Cu and may be applied to the stack 1 as a metal paste and fired in.

The internal electrodes 20 are led along the stacking direction alternately as far as one of the external electrodes 30 and are at a distance from the second external electrode 30. In this way, the external electrodes 30 are electrically connected alternately to the internal electrodes 20 along the stacking direction. In order to produce the electrical connection, a connection element (not shown here) may be applied to the external electrodes 30, for example, by soldering.

The production of the multi-layered structural element shown in FIG. 1, which contains weakening layers 21, is to be explained in more detail with the aid of the following exemplary embodiment:

To form the stack 1, a ply containing an auxiliary material is applied to at least one green sheet. A CuPd paste is printed onto green sheets as the electrode material. The auxiliary material contains CuO.

Figure 4:
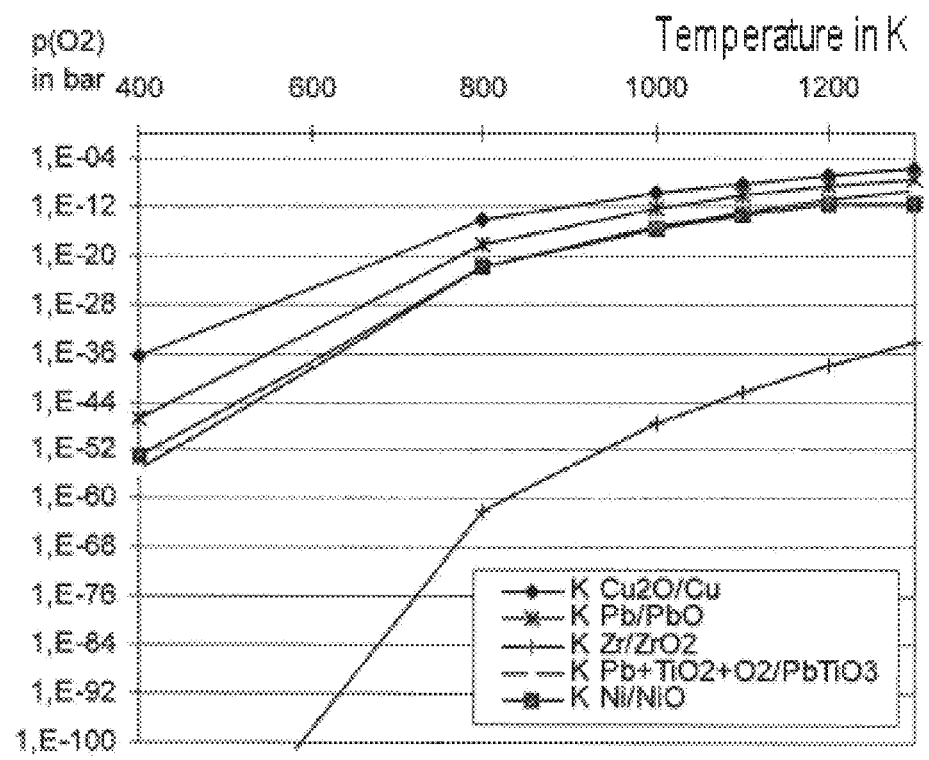
FIG. 4 shows equilibrium curves of the systems $Cu_2O/Cu$, Pb/PbO, $Zr/ZrO_2$, $Pb+TiO_2+O_2/PbTiO_3$ and Ni/NiO for different oxygen partial pressures and temperatures.

If a temperature of 500 to 600° C., at which compaction of the stack 1 still does not occur, is then reached during debindering under a reducing atmosphere, i.e. using an equilibrium partial pressure of the oxygen lying between the curves Pb/PbO and $Cu_2O/Cu$ (such that PbO and Cu are present at the same time) (see, e.g., FIG. 4), copper ions diffuse from the auxiliary material in the direction of the adjacent electrode layers 20. Moreover, the copper ions and further copper oxide from the auxiliary material are reduced to form copper metal. As a result, the ply containing the auxiliary material is degraded and therefore the weakening layer 21 is formed. The porosity of the weakening layer can be set or influenced, for example, by the grain size of the CuO used.

The diffusion per se is promoted by the difference in concentration of Cu which is present in the ply containing the auxiliary material or containing the components formed from the auxiliary material and in the electrode material.

FIG. 2a shows an enlarged excerpt of the schematic side view of the multi-layered structural element. The formation of cracks in multi-layered structural elements is to be explained with the aid of this figure.

The structural element expands in the longitudinal direction when a voltage is applied between the external electrodes 30. In a so-called active zone, in which adjacent internal electrodes 20 in the stacking direction overlap, an electric field arises when a voltage is applied to the external electrodes 30, such that the piezoelectric layers 10 expand in the longitudinal direction. In inactive zones, in which adjacent electrode layers 20 do not overlap, the piezo actuator expands only slightly.

On account of the different expansion of the structural element in the active and inactive zones, mechanical stresses occur in the stack 1. Such stresses can lead to poling cracks and/or relaxation cracks 25 in the stack 1.

FIG. 2a shows an excerpt from a stack 1 composed of piezoelectric layers 10 and internal electrodes 20, wherein a crack 25 has arisen in the stack 1. The crack 25 runs within the inactive zone parallel to the internal electrodes 20, bends away at the transition into the active zone and runs in the active zone through adjacent internal electrodes 20 of differing polarity. This can lead to a short circuit of the internal electrodes 20.

Figure 2B:
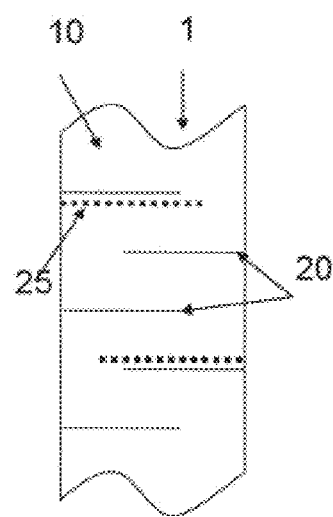

FIG. 2b shows an excerpt from a stack 1 composed of piezoelectric layers 10 and internal electrodes 20, in which a crack 25 has likewise arisen. Here, the crack 25 runs parallel to the internal electrodes 20. In the case of such a course of cracks 25, the risk of short circuits is reduced.

In order to promote such a course of cracks 25, the multi-layered structural element is produced according to the aforementioned method, so that the cracks 25 form in a targeted manner in the region of the weakening layer 21, in which there is a predetermined breaking point.

Figure 3A:
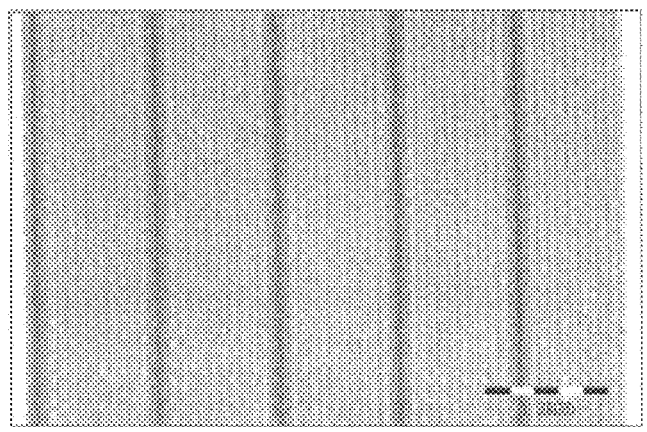
FIG. 3a shows an optical micrograph (magnification 1:170) of a multi-layered structural element in profile after debindering, the copper oxide being 100% $Cu_2O$ and the copper present in the layers have been blackened.
Figure 3B:
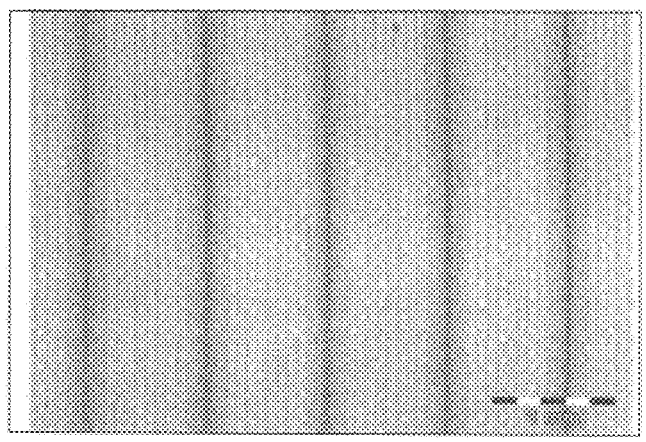
FIG. 3b shows an optical micrgraph (magnification 1:150) of a multi-layered structural element in profile after debindering, the coppper oxide being 100% CuO and the copper present in the layers have been blackened.
Figure 3C:
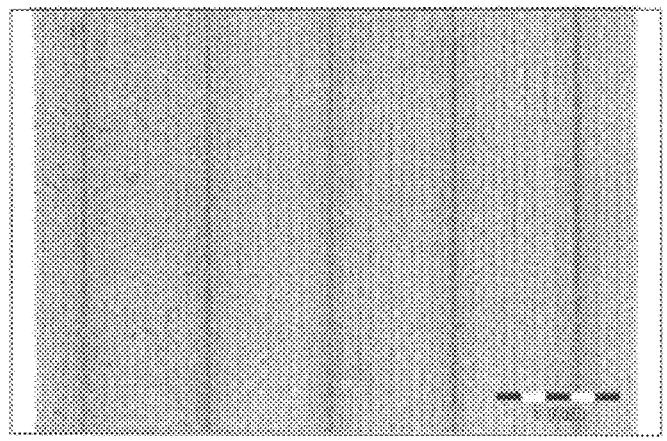
FIG. 3c shows an optical micrograph (magnification 1:170) of a multi-layered structural element in profile after debindering, the coppper oxide being 50%Cu/50% CuO and the copper present in the layers have been blackened.
Figure 3D:
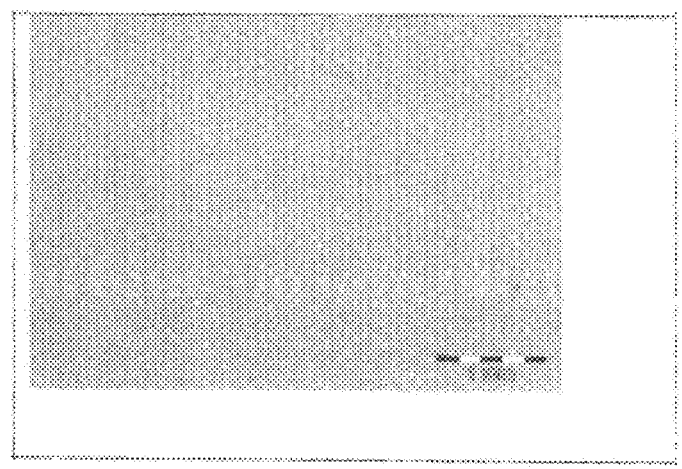
FIG. 3d shows an optical micrograph (magnificaton 1:150) of a multi-layered structural element in profile after debindering for reference, no weakening layer being present.

FIGS. 3a to 3d show optical micrographs (magnification 1:170 (FIGS. 3a to 3c) and 1:150 (FIG. 3d))) of a multi-layered structural element in profile after the debindering method has been carried out under a reducing atmosphere. Here, 100% $Cu_2O$ was used in FIG. 3a, 100% CuO was used in FIG. 3b and 50% Cu/50% CuO was used in FIG. 3c. FIG. 3d shows a multi-layered structural element without weakening layers for comparison. The degree of blackening in FIGS. 3a to 3d is in direct correlation with the copper content in the ceramic layers. It was possible to make the verification using laser ablation in combination with ICP/MS. The reaction which takes place here is as follows: $CuO \rightarrow Cu+0.5\ O_2$ or $Cu_2O \rightarrow 2\ Cu+0.5\ O_2$. Copper cations diffuse faster than metallic copper. The greater the oxygen proportion of the added Cu component, the greater the extent of diffusion in the debindering process. In case d), there is no copper oxide component, and therefore the diffusion is not stronger or weaker than in the case of all the other Cu electrodes.

In FIG. 3a, the blackening proceeding from the auxiliary material reaches as far as the two adjacent electrode layers. In FIG. 3b, the blackening even encompasses two adjacent electrode layers on each side of the auxiliary layer. It can therefore be seen from a comparison of FIGS. 3a and 3b that the region in which blackening occurs is approximately twice as large in FIG. 3b than in FIG. 3a. It follows from this that CuO (oxidation number of the copper: 2) is preferred to $Cu_2O$ as auxiliary material, since divalent copper has a higher degree of diffusion and a greater length of diffusion.

In FIG. 3c, in which 50% Cu/50% CuO is used as the auxiliary material, the blackening is locally limited and does not extend as far as the adjacent electrode layers. The degree of diffusion and length of diffusion of the copper in the ceramic material adjacent to the auxiliary layer therefore decrease when the auxiliary material additionally contains copper metal (oxidation number 0). It is therefore preferable to use an auxiliary material which does not contain any copper metal.

The invention is not limited by the description with reference to the exemplary embodiments. Instead, the invention encompasses any new feature and also any combination of features which, in particular, contains any combination of features in the patent claims, even if this feature or this combination itself is not explicitly indicated in the patent claims or exemplary embodiments.

The invention claimed is:

1. A method for producing a multi-layered structural element, the method comprising:
    providing an electrode material comprising copper and green sheets containing a dielectric material;
    providing an auxiliary material containing at least one copper oxide;
    forming a stack comprising the dielectric green sheets, at least one ply containing the auxiliary material and layers containing the electrode material arranged alternately one above another; and
    debindering and sintering the stack comprising diffusing and reducing the at least one copper oxide of the at least one ply so that copper ions diffuse from the auxiliary material to adjacent electrode layers thereby forming the multi-layered structural element comprising at least one weakening layer and dielectric ceramic layers with internal electrode layers arranged between them, the internal electrode layers consisting essentially of a metal comprising copper,
    wherein the weakening layer has a reduced fracture strength compared to the dielectric ceramic layers, and
    wherein a concentration of the copper in the electrode material is present in a smaller proportion than a concentration of copper in the auxiliary material, the copper in the auxiliary material being part of the at least one copper oxide.

2. The method according to claim 1, wherein debindering and sintering comprises applying oxygen partial pressure thereby reducing the at least one copper oxide to a copper metal.

3. The method according to claim 2, wherein reducing the at least one copper oxide to the copper metal is concluded after debindering.

4. The method according to claim 1, wherein the copper oxide is CuO.

5. The method according to claim 1, wherein the copper oxide is $Cu_2O$.

6. The method according to claim 1, wherein the auxiliary material consists of one component.

7. The method according to claim 1, wherein the dielectric material is a piezoelectric material.

8. A method for producing a multi-layered structural element, the method comprising:
    providing green sheets comprising a dielectric material;
    providing an electrode material comprising copper on some of the green sheets;
    providing plies, each ply comprising an auxiliary material containing at least one copper oxide;
    forming a stack comprising the dielectric green sheets and a ply between adjacent green sheets with the electrode material; and
    debindering and sintering the stack comprising reducing and diffusing the at least one copper oxide of the plies so that copper ions diffuse from the auxiliary material to the adjacent electrode material thereby forming the multi-layered structural element comprising electrode layers formed from the electrode material, weakening layers formed from the plies and dielectric ceramic layers formed from the green sheets, the electrode layers comprising a copper metal,
    wherein the weakening layers have a reduced fracture strength compared to the dielectric ceramic layers, and
    wherein a concentration of the copper in the electrode material is present in a smaller proportion than a concentration of copper in the auxiliary material, the copper in the auxiliary material being part of the at least one copper oxide.

9. The method according to claim 8, wherein the at least one copper oxide is CuO.

10. The method according to claim 8, wherein the at least one copper oxide is $Cu_2O$.

11. The method according to claim 8, wherein the at least one copper oxide consists of CuO.

12. The method according to claim 8, wherein the at least one copper oxide consists of $Cu_2O$.

13. The method according to claim 8, wherein the dielectric ceramic layers comprise lead zirconate titanate (PZT), and wherein the lead zirconate titanate (PZT) is $Pb(Zr_xTi_{1-x})O_3$, where $0 \leq x \leq 1$.

14. The method according to claim 8, wherein the dielectric ceramic layers comprise a lead free ceramic.

15. The method according to claim 8, wherein the electrode material comprises a CuPd paste.

16. The method according to claim 8, wherein the weakening layers are porous layers.

17. The method according to claim 8, wherein debindering comprises debindering at a temperature between 500° C. and 600° C.

18. The method according to claim 17, wherein sintering comprises sintering at a temperature of 1010° C.

19. The method according to claim 18, further comprising forming external electrodes on opposite faces of the stack after sintering, wherein forming the external electrodes comprises applying a metal paste comprising copper or silver on opposite faces of the stack and firing the metal paste.

* * * * *